United States Patent
Ho

(10) Patent No.: US 8,384,164 B1
(45) Date of Patent: Feb. 26, 2013

(54) INTERCONNECT STRUCTURE

(75) Inventor: Jonathan Jung-Ching Ho, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/099,698

(22) Filed: May 3, 2011

Related U.S. Application Data

(63) Continuation of application No. 11/891,258, filed on Aug. 8, 2007, now Pat. No. 7,951,722.

(51) Int. Cl.
*H01L 27/088* (2006.01)

(52) U.S. Cl. .......................... 257/401; 257/412

(58) Field of Classification Search .................. 257/401, 257/412; 438/587
See application file for complete search history.

(56) References Cited

U.S. PATENT DOCUMENTS

| | | | |
|---|---|---|---|
| 6,235,440 B1 | 5/2001 | Tao et al. | |
| 6,337,163 B1 | 1/2002 | Sato | |
| 6,852,471 B2 | 2/2005 | Pierrat et al. | |
| 7,015,148 B1 | 3/2006 | Lukanc et al. | |
| 7,951,722 B2 * | 5/2011 | Ho | 438/719 |
| 2002/0004182 A1 | 1/2002 | McReynolds | |
| 2002/0102471 A1 | 8/2002 | Lukanc | |
| 2004/0054981 A1 | 3/2004 | Okagawa et al. | |
| 2005/0048410 A1 | 3/2005 | Tanaka | |
| 2006/0105542 A1 | 5/2006 | Yoo | |
| 2007/0092844 A1 | 4/2007 | Yang | |
| 2007/0099424 A1 | 5/2007 | Rathsack et al. | |

OTHER PUBLICATIONS

U.S. Appl. No. 11/891,258, filed Aug. 8, 2007, Ho.

* cited by examiner

*Primary Examiner* — Mark Prenty
(74) *Attorney, Agent, or Firm* — Michael T. Wallace; Thomas George

(57) ABSTRACT

An interconnect structure includes a substrate, a first diffusion region within the substrate, a plurality of first lines on the substrate and the first diffusion region, a first enclosure coupled to an end of the plurality of first lines, and a first contact within the first enclosure. The interconnect structure further includes a second diffusion region within the substrate, a plurality of second lines on the substrate and the second diffusion region, a second enclosure coupled to an end of the plurality of second lines, and a second contact within the second enclosure. A spacing can be present between the plurality of first lines and the plurality of second lines. The plurality of first lines, the first contact, the plurality of second lines, and the second contact are trimmed, but the first enclosure, the second enclosure, and the spacing are not trimmed.

4 Claims, 6 Drawing Sheets

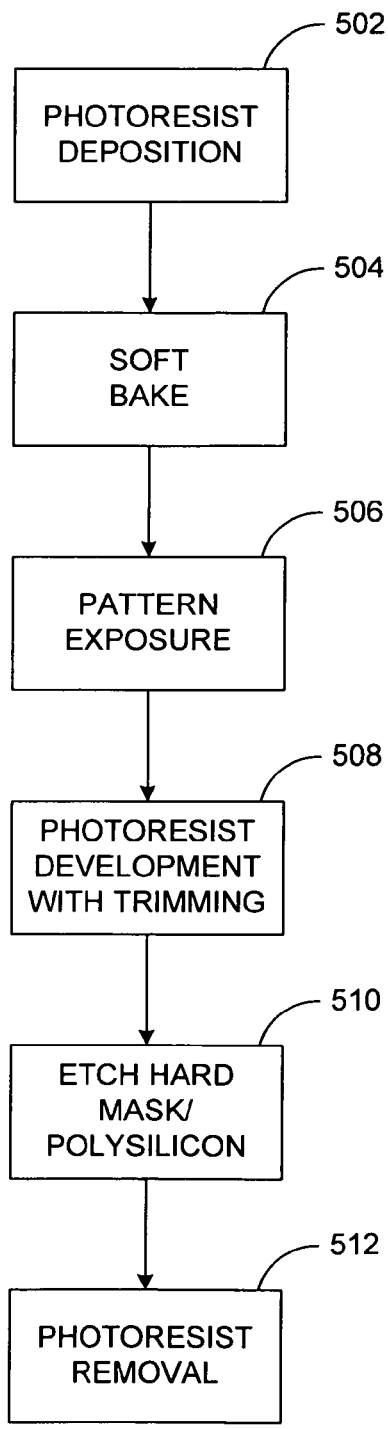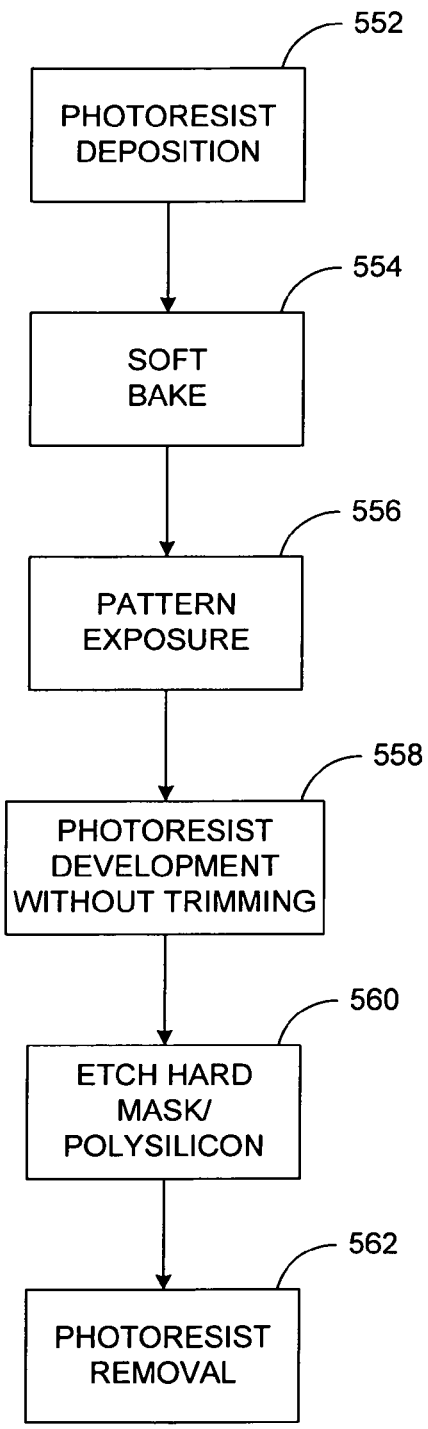
FIG. 5A
FIG. 5B

INTERCONNECT STRUCTURE

CROSS-REFERENCE TO RELATED APPLICATION

This application is a continuation of U.S. patent application having the application Ser. No. 11/891,258 filed on Aug. 8, 2007 and titled "A DOUBLE EXPOSURE SEMICONDUCTOR PROCESS FOR IMPROVED PROCESS MARGIN" by Jonathan Jung-Ching Ho.

FIELD OF THE INVENTION

The present invention generally relates to advanced semiconductor processing, and more particularly, to a microlithographic exposure process for improved process margin.

BACKGROUND

Advances in the field of semiconductor integrated circuits have brought about higher levels of integration. Accordingly, semiconductor manufacturing process advancements are driving the corresponding geometric dimensions of semiconductor devices to decreasingly smaller values. 10 micrometer (μm) gate lengths, for example, were common in the 1970's, but continuously advancing semiconductor manufacturing processes have reduced gate lengths to well below 100 nanometer (nm).

Continuing efforts to achieve higher levels of integration have also led to reductions in the separation distance between adjacent semiconductor features. For example, nanometer processes producing 65 nm and 45 nm gate lengths require a device spacing of, e.g., 120 nm to achieve reasonable yields within specified process margins.

In order to define the nanometer features and associated device spacing on a semiconductor substrate, geometric patterns defining such features must first be superimposed upon the semiconductor substrate. Several layers of geometric patterns are often required, whereby each pattern is superimposed upon each previous pattern during semiconductor substrate development. The geometric patterns that are used to define the various layers on the semiconductor substrate are defined by a process known as microlithography.

Generally speaking, the microlithographic process consists of several steps, whereby various layers of a starting material are first developed. The starting material, for example, may initially consist of a silicon or germanium substrate having gate oxide and polycrystalline silicon (polysilicon) layers deposited thereon.

Next, a hard mask layer may be applied in order to improve certain microlithographic qualities and etch resistance of a photoresist layer that is subsequently applied on top of the hard mask layer. Using a hard mask layer below the photoresist layer, for example, allows a reduction in the thickness of the photoresist layer, which becomes increasingly important as features defined by the photoresist patterns fall below 100 nm.

Finally, a layer of photoresist material is deposited above the hard mask layer by spin coating a uniform layer of photoresist over the entire surface of the starting material. The photoresist layer may then be selectively exposed to geometrically defined patterns of radiation, such as ultraviolet (UV) light, whereby the exposed areas are defined by an exposure tool, photomask, and/or computer data. A bottom anti-reflective coating (BARC) may also be deposited between the hard mask layer and the photoresist layer, so as to minimize detrimental interference effects that are caused by the photoresist exposure process, such as photoresist line width variation.

After exposure, the photoresist is subjected to a development process that converts the latent image in the photoresist into the final image. An oxygen plasma trimming process may also be employed to remove quantities of unwanted photoresist that remain after the photoresist development process is complete. The final image serves as the mask in subsequent subtractive, e.g., etching, or additive, e.g., ion implantation, steps to selectively remove, or deposit, material from/to the starting material to produce certain device features in the nanometer range.

The nanometer processes targeted at producing 65 nm feature sizes typically require final images that exhibit feature sizes on the order of, e.g., 50 nm. Obtaining 50 nm feature sizes using conventional single exposure processes, however, is challenging. As such, an exposure and development process is first employed to generate oversized features, e.g., 80 nm, within the final image of the photoresist layer. An oxygen plasma trimming process, for example, is then employed, whereby the photoresist is trimmed, both horizontally and vertically, to reduce the photoresist features defined by the final image from 80 nm to 50 nm.

Through use of the photoresist trimming process, the sizes of certain critical feature patterns, such as transistor gate length, may be advantageously reduced. Unfortunately, the photoresist trimming process also produces an undesirable reduction in the sizes of other critical feature patterns, such as poly-to-contact enclosure patterns and field poly width, thereby increasing the poly-to-contact and field poly line resistance beyond acceptable process margins. Efforts continue, therefore, to identify photoresist exposure, development, and trimming processes that provide selective reduction in certain critical pattern dimensions, while suppressing reduction in other critical pattern dimensions.

SUMMARY

To overcome limitations in the prior art, and to overcome other limitations that will become apparent upon reading and understanding the present specification, various embodiments of the present invention disclose a double exposure semiconductor process for improved process margin.

In accordance with an embodiment of the invention, an interconnect structure can include a substrate, a first diffusion region within the substrate, a plurality of first lines on the substrate and the first diffusion region, a first enclosure coupled to an end of the plurality of first lines, and a first contact within the first enclosure. The interconnect structure can further include a second diffusion region within the substrate, a plurality of second lines on the substrate and the second diffusion region, a second enclosure coupled to an end of the plurality of second lines, and a second contact within the second enclosure. A spacing can be present between the plurality of first lines and the plurality of second lines. The plurality of first lines, the first contact, the plurality of second lines, and the second contact are trimmed, but the first enclosure, the second enclosure, and the spacing are not trimmed.

In accordance with another embodiment of the invention, a method of forming an interconnect structure can include applying a first layer of photoresist to a starting material, exposing the first layer of photoresist to ultraviolet radiation to form a first latent image of the interconnect structure within the first layer of photoresist, developing the first layer of photoresist to convert the first latent image of the interconnect structure to a first final image of the interconnect structure, trimming the first final image of the interconnect structure to form a first trimmed final image, removing the first layer of photoresist, applying a second layer of photoresist to the starting material, exposing the second layer of photoresist to ultraviolet radiation to form a second latent image of the interconnect structure within the second layer of photoresist, developing the second layer of photoresist to convert the second latent image of the interconnect structure to a second final image of the interconnect structure, and transferring the first trimmed final image and the second final image of the interconnect structure to a polysilicon layer of the starting material without trimming the second final image of the interconnect structure.

BRIEF DESCRIPTION OF THE DRAWINGS

Various aspects and advantages of the invention will become apparent upon review of the following detailed description and upon reference to the drawings in which:

FIG. 5A illustrates an exemplary flow diagram of processing steps executed during the first processing sequence used to form a portion of the interconnect pattern of FIG. 2;

FIG. 5B illustrates an exemplary flow diagram of processing steps executed during the second processing sequence used to form a portion of the interconnect pattern of FIG. 2.

DETAILED DESCRIPTION

Figure 1:
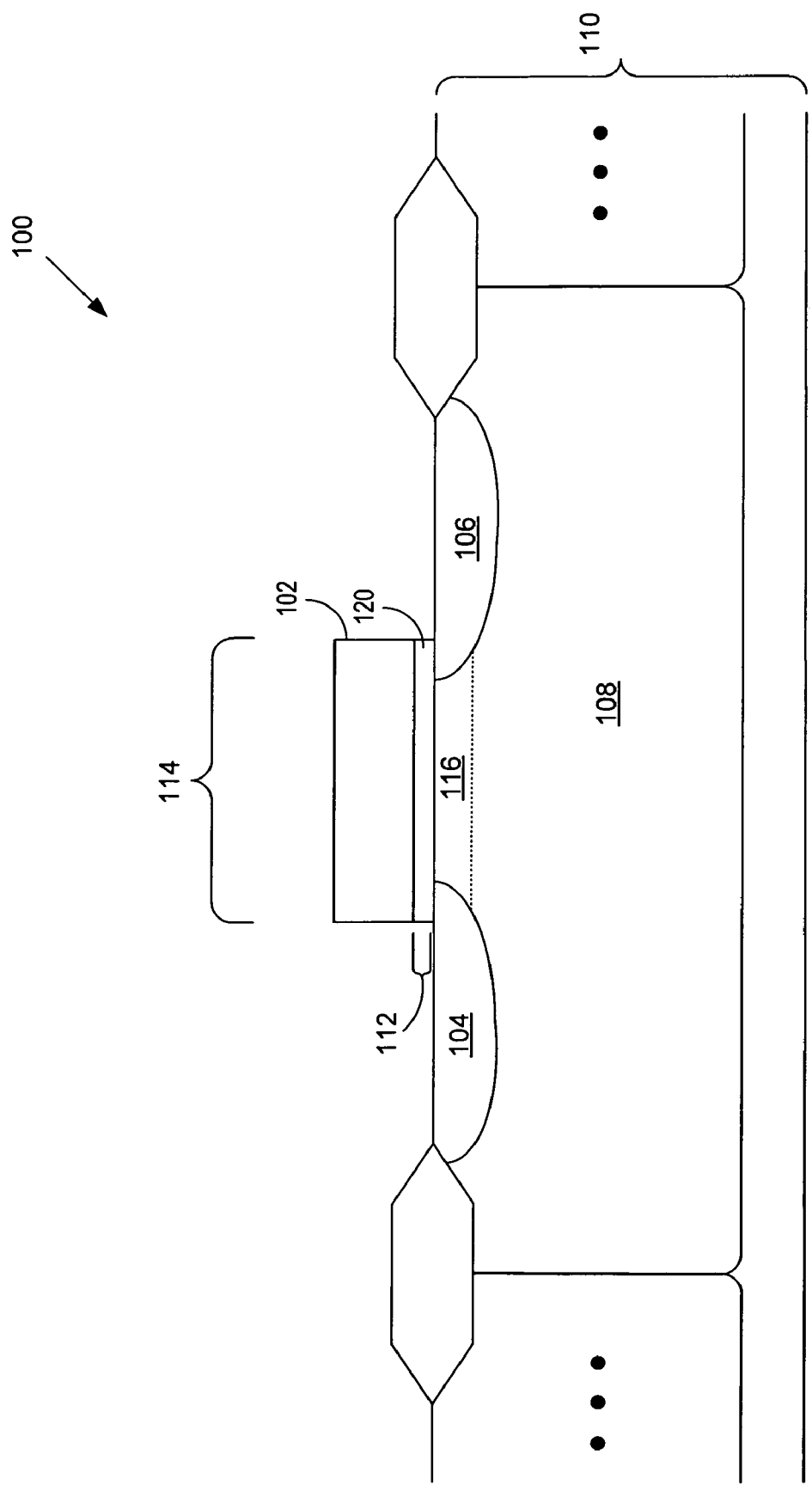
FIG. 1 illustrates a cross-sectional view of a typical semiconductor device.

Generally, various embodiments of the present invention provide a double exposure semiconductor process for improved process margin at nanometer feature sizes. In one embodiment of the present invention, a starting material comprising various layers, such as a silicon or germanium substrate, silicon dioxide, polycrystalline silicon (polysilicon), hard mask, and bottom anti-reflective coating (BARC) is formed on a semiconductor wafer (wafer). Next, a photoresist layer is spin-coated on the wafer to produce a uniform, adherent, defect-free, polymeric film of a desired thickness over the entire wafer.

The wafer is then soft-baked, so as to drive solvent out of the spun-on photoresist and to relieve photoresist film stresses encountered by the spinning process. Next, a first exposure process is used to create an exposed image in the photoresist to define certain device features within the photoresist. A subsequent photoresist development and trimming process is then executed to reduce the exposed device features into a final photoresist image that complies with pre-determined critical dimensions (CDs). A subsequent hard mask etching process may then be executed to form a first set of hard mask images on the wafer that fall within pre-determined tolerances for increased process margin.

In another embodiment, the hard mask etching process may also be used to etch the polysilicon, so as to create polysilicon images on the wafer that fall within pre-determined tolerances for increased process margin. In alternate embodiments, the polysilicon etching process may be postponed until after the second exposure process is completed. In addition, the remaining photoresist may be removed after the hard mask is etched, or conversely, the photoresist may be left on the wafer and used during the second process sequence.

Once the first set of hard mask images are formed on the wafer, a second process sequence is executed, whereby another layer of photoresist may optionally be spin-coated and soft-baked onto the wafer, given that the first layer of photoresist was removed during the first process sequence. A second exposure and development process is then used to create a second exposed image that defines device features in the photoresist. The second exposed image, however, does not require a photoresist trimming process. Instead, the polysilicon features that are required after the second exposure may be created by implementing hard mask and polysilicon etching processes that may be controlled to tight design tolerances.

As such, undesirable reductions in the feature sizes of critical patterns, such as poly-to-contact enclosure patterns, are eliminated because the poly-to-contact enclosure patterns are formed without the need to trim the corresponding photoresist. In addition, critical device spacing dimensions may be controlled to tighter tolerances, since the hard mask and polysilicon etching processes that are used to create the device spacing may also be controlled to tighter design tolerances.

Turning to FIG. 1, an exemplary cross-section of field effect transistor (FET) 100 is illustrated, whereby FET 100 is illustrated as one of many device features that may be fabricated within semiconductor substrate 110 to form an integrated circuit (IC). It is understood that FET 100 may be widely used as a basic building block within ICs, such as programmable logic devices (PLDs). As such, FET 100, and related semiconductor devices, may be used as fundamental building blocks to produce an array of programmable tiles within the PLD, which includes Input/Output Blocks (IOBs), Configurable Logic Blocks (CLBs), dedicated Random Access Memory Blocks (BRAMs), multipliers, Digital Signal Processing blocks (DSPs), processors, clock managers, Delay Lock Loops (DLLs), Multi-Gigabit Transceivers (MGTs), and the like.

Semiconductor substrate 110, hereinafter referred to as substrate 110, is formed of a semiconductive material, such as a single-crystal silicon or germanium, which serves as a base platform for the implementation of semiconductor devices. Well region 108, for example, is typically formed within substrate 110 by introducing well dopants into a diffusion region of substrate 110 whose dimensions may be defined by a microlithographic process. Well region 108 may be formed as a diffused-well structure, in which a shallow ion implant process, followed by a high temperature, diffusion step, drives well region 108 deep into substrate 110. Alternately, well region 108 may be formed as a retrograde-well structure, in which a high-energy, ion implant process creates a deep implant peak within substrate 110 without the need to implement a high-temperature diffusion step.

Well region 108 may be doped with n-type, or p-type, dopants depending upon the conductivity type that is required of FET 100. If an n-type FET (NFET) is required, for example, then well region 108 represents a p-well region that is to be formed using p-type dopants. If, on the other hand, a p-type FET (PFET) is required, then well region 108 represents an n-well region that is to be formed using n-type dopants.

Regions 104,106 form the source and drain regions of FET 100 and are each doped with the same, or similar, doping materials. Regions 104,106 are doped as n-type regions given that FET 100 is to be constructed as an NFET. Conversely, regions 104,106 are doped as p-type regions given that FET 100 is to be constructed as a PFET. Regions 104 and 106 may be formed as diffused-well, or retrograde-well, structures as discussed above. In any event, well region 108 and regions 104,106 may be collectively referred to as the diffusion region of FET 100.

Gate 102 is typically formed over a portion of the diffusion region of FET 100, such that gate 102 overlaps a portion of regions 104,106 as illustrated. Using polysilicon to form gate 102, a conductive property is created such that gate 102 may also be used as an interconnect. However, should gate length 114 be reduced below a certain minimum length, such as 1.25 μm, the resistance of gate 102 becomes too large to be effective as an interconnect. As discussed in more detail below, therefore, a metal silicide layer may be used to clad the surface of the polysilicon gate 102 to form a so-called "polycide structure". Use of the polycide structure to form gate 102 reduces the resistance of gate 102 so as to allow use of gate 102 as an interconnect.

Gate oxide layer 120 exists between gate 102 and regions 104-108 to form the gate dielectric, or insulator, between regions 104, 106 and channel region 116. Gate oxide layer 120 is generally fabricated with a thermally grown layer of silicon dioxide, whose thickness has historically been scaled to linearly track the scaling of gate length 114. For example, the ratio of gate length 114 to gate oxide thickness 112 has historically been maintained at approximately 45. Thus, for a 65 nm gate length, approximately 14 angstroms of gate oxide are required.

In operation, FET 100 is made conductive by applying a voltage differential across gate 102 and region 104 and/or 106, thus forming channel region 116. Given that FET 100 is an NFET, for example, then once the differential voltage across gate 102 and source region, e.g., region 104, exceeds the threshold voltage of FET 100, a current conduction path is caused to exist within channel region 116, between regions 104 and 106, by attracting carriers into channel region 116 from well region 108. The current being generated while FET 100 is in a conductive state is often referred to as the drain current of FET 100.

Gate length 114 represents a design feature of FET 100 that has been consistently scaled over time to obtain certain benefits. First, with an applied voltage differential as discussed above, gate length scaling leads to an increase in the drain current of FET 100, which usually provides an increase in circuit speed. Second, gate length scaling leads to a decrease in gate capacitance, which also increases circuit speed, since the gate capacitance must be charged/discharged when logic levels are switched. Third, gate length scaling leads to an increased density of devices that can be fabricated on substrate 110. As discussed in more detail below, gate 102 may also be interconnected with other devices (not shown) that may also be formed within substrate 110.

Figure 2:
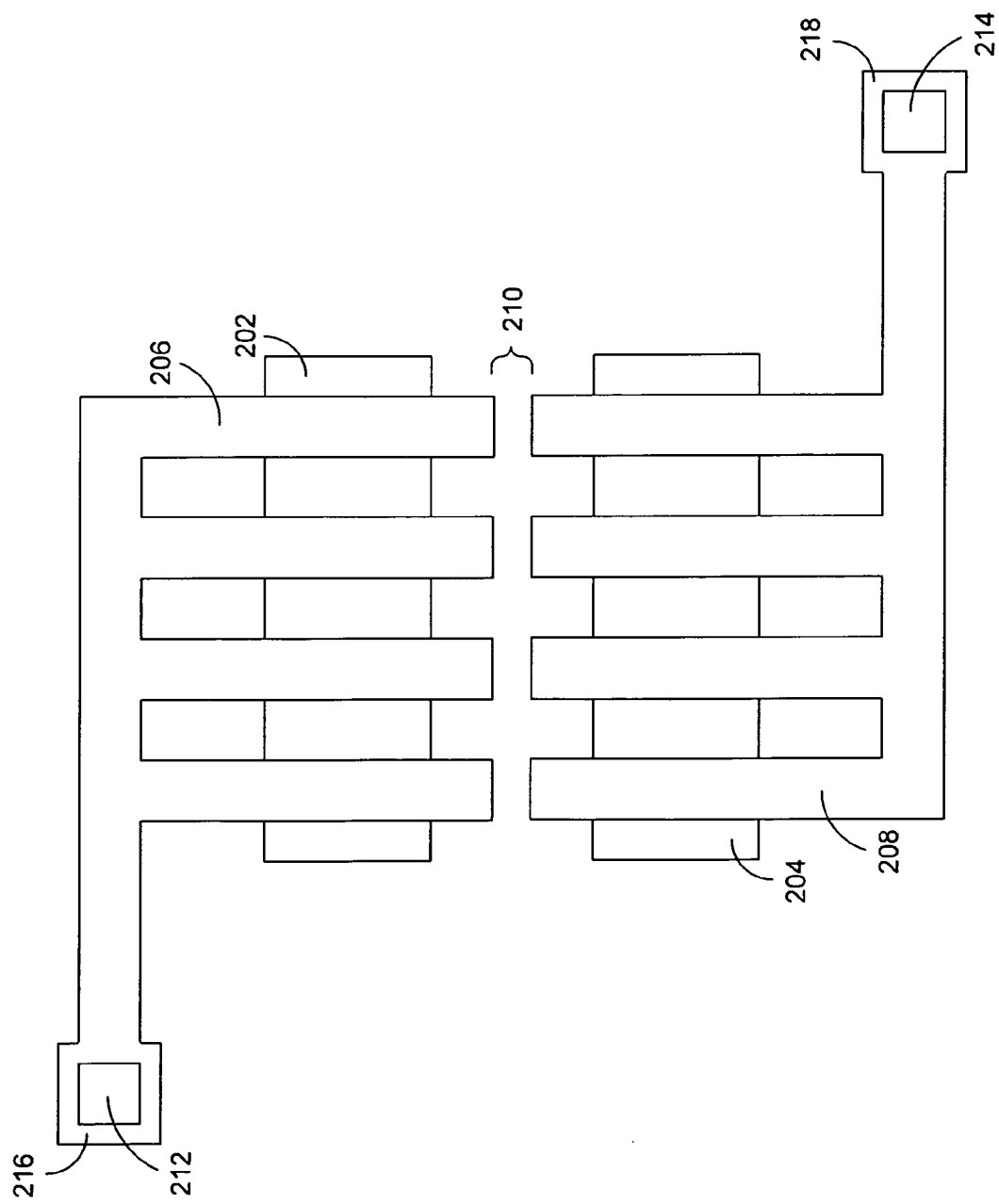
FIG. 2 illustrates an exemplary interconnect pattern that is formed after first and second processing sequences are executed in accordance with an embodiment of the present invention.

Turning to FIG. 2, an interconnect diagram is exemplified, whereby a top view of substrate 110 illustrates a pattern of polysilicon lines 206, 208 that are disposed upon substrate 110 and diffusion regions 202, 204. Diffusion regions 202, 204 may represent multiple diffusion regions, including well regions 108 and source/drain regions 104, 106 of multiple devices that are implemented within substrate 110 as discussed above in relation to embodiments represented by FIG. 1.

For example, polysilicon lines 206 may form an interconnect structure, whereby the gates of multiple FETs formed over diffusion region 202 may be commonly connected to contact region 212 via polysilicon interconnect 206. Similarly, polysilicon lines 208 may form an interconnect structure, whereby the gates of multiple FETs formed over diffusion region 204 may be commonly connected to contact region 214 via polysilicon interconnect 208. It is noted, however, that the interconnect structure of FIG. 2 is purely exemplary and is representative of a virtually endless number of interconnect structures that may exist on any given IC.

Contact regions 212, 214 represent polysilicon-silicide (polycide) regions, whereby polysilicon enclosures 216, 218 are combined with certain metallic silicides to lower the resistivity and raise the thermal stability of contact regions 212, 214. As such, the application of polysilicon lines 206, 208 and contact regions 212, 214 as local interconnect structures is enhanced due to the advantages that are provided by the polycide regions.

To form contact regions 212, 214, various refractory metal silicides including tungsten silicide ($WSi_x$), tantalum silicide ($TaSi_2$), titanium silicide ($TiSi_2$), cobalt silicide ($CoSi_2$), nickel silicide (NiSi), and molybdenum disilicide ($MoSi_2$) may be applied. In one embodiment, contact regions 212, 214 are formed after polysilicon lines 206, 208 have been patterned. In such an instance, the silicides may be used as self-aligning silicides (salicides) after polysilicon interconnects 206, 208 have been patterned. Using salicides after patterning polysilicon interconnects 206, 208 serves to obviate the need to implement the masking and etching processes that would otherwise be required if the silicides were created during the polysilicon interconnect patterning process.

In one embodiment, in order to minimize the resistance of contact regions 212, 214, however, a first design rule is enforced for improved process margin. In particular, the surface area of polysilicon enclosures 216, 218 remains larger than the surface area of contact regions 212, 214 after all processing steps have been completed. That is to say, in other words, that the contact resistance between contact regions 212, 214 and respective polysilicon enclosures 216, 218 is minimized when the surface area of polysilicon enclosures 216, 218 is larger than the surface area of contact regions 212, 214, respectively.

As discussed in more detail below, therefore, formation of polysilicon enclosures 216, 218 is delayed until after the photoresist trimming process, which ultimately defines the feature size of polysilicon interconnects 206, 208, is executed. As such, the photoresist trimming process is not allowed to similarly reduce the feature size of polysilicon enclosures 216, 218. Instead, the feature size of polysilicon enclosures 216, 218 is created with a hard mask and polysilicon etching process that occurs after the photoresist trimming process. Thus, the surface area of polysilicon enclosures 216, 218 is virtually guaranteed to be larger than the surface area of contact regions 212, 214 because the photoresist that ultimately defines polysilicon enclosures 216, 218 is not subjected to the photoresist trimming process that defines the feature size of polysilicon interconnects 206, 208.

A second design rule may be similarly enforced, whereby device spacing 210 is minimized. In particular, the hard mask and polysilicon etching process that is used to form polysilicon enclosures 216 and 218, is also used to create device spacing 210. By minimizing device spacing 210, the density of devices formed within substrate 110 may be increased.

Conversely, minimization of device spacing 210 decreases the size of substrate 110 that is required to accommodate a specified number of devices. Thus, the formation of an equivalent number of devices on a smaller portion of substrate 110 is facilitated.

Figure 3:
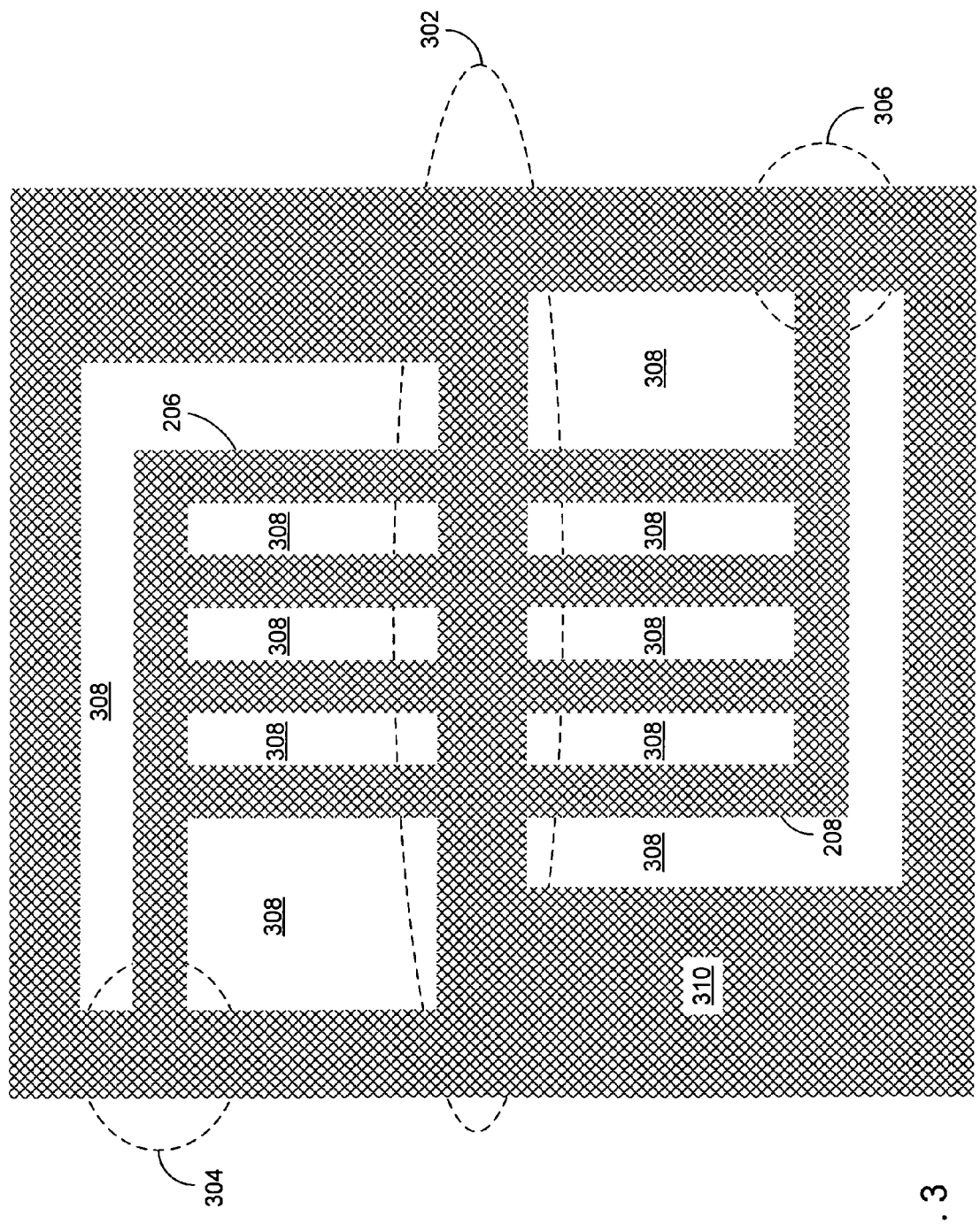
FIG. 3 illustrates an exemplary exposure mask pattern used for the first processing sequence during the formation of the interconnect pattern of FIG. 2.

Turning to FIG. 3, an exemplary exposure mask pattern is illustrated that defines the lithographic image that is to be projected onto a starting material after a first exposure. In particular, the exposure mask pattern of FIG. 3 exemplifies a mask pattern that ignores the critical dimensions (CDs) of polysilicon in areas 302-306. Instead, areas 302-306, which ultimately define device spacing 210 and polysilicon enclosures 216, 218, respectively, are left insoluble to the trimming and etching processes of a first process sequence that forms interconnect lines 206, 208. As such, polysilicon in areas 302-306 may be left intact to be subsequently formed during a second process sequence that does not utilize a photoresist trimming procedure.

Figure 4:
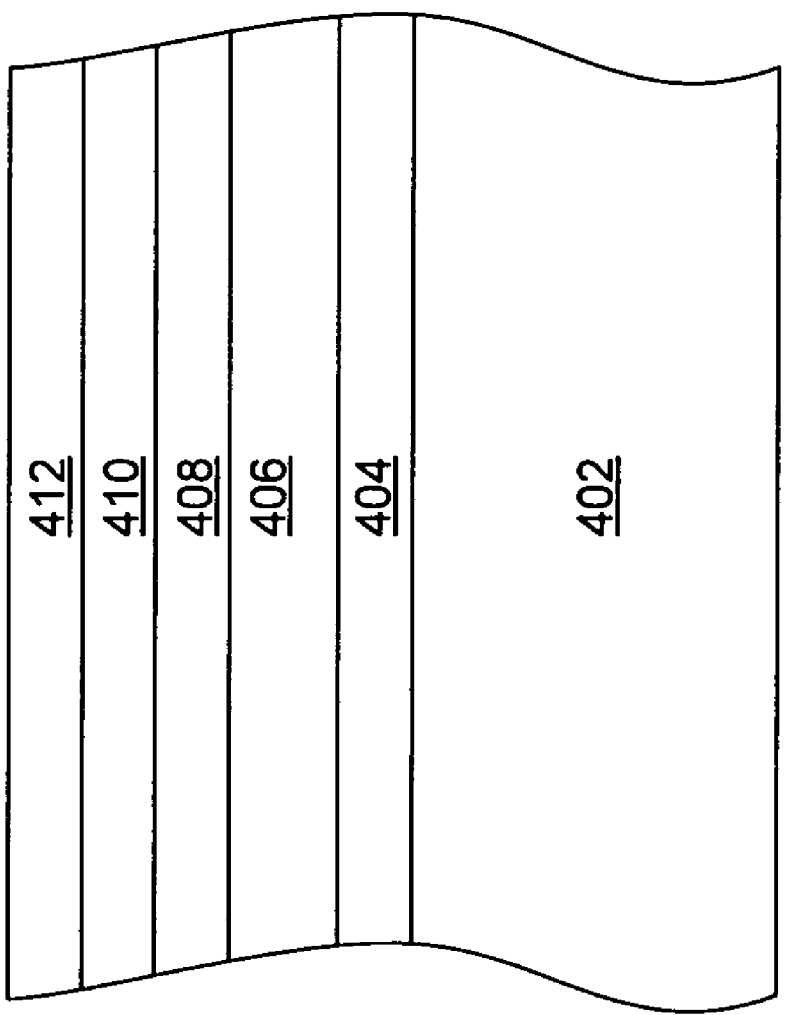
FIG. 4 illustrates a cross-sectional view of an exemplary starting material used during the formation of the semiconductor device of FIG. 1 and the formation of the interconnect pattern of FIG. 2.

Turning to FIG. 4, a cross-section diagram is illustrated that exemplifies the various layers of a starting material that may be subsequently processed to form the device and interconnect structures as exemplified in FIGS. 1 and 2, respectively. Layer 402 exemplifies a layer of semiconductive material, such as a single-crystal silicon or germanium, which serves as a base platform for the implementation of the diffusion regions, as required by certain semiconductor devices, such as FET 100 as exemplified in FIG. 1. Layer 404 exemplifies a layer of oxide material, such as silicon dioxide, that may be utilized to form the gate dielectric, or insulator, between multiple gate contacts and channel regions of various semiconductive devices formed within semiconductor substrate 402.

Layer 406 exemplifies a layer of polysilicon that, as discussed in more detail below, may ultimately form a polysilicon interconnect structure, such as the polysilicon interconnect structure as exemplified in FIG. 2. Layer 408 exemplifies a hard mask layer that may be deposited onto polysilicon layer 406 to enhance certain characteristics of photoresist layer 412. As device features become smaller, for example, higher resolution microlithographic processes are required, which dictates the use of a thinner photoresist layer 412. As such, hard mask layer 408 combines with a reduced thickness photoresist layer 412 to enhance the microlithographic and etch performance of photoresist layer 412. Layer 410 exemplifies a bottom anti-reflective coating (BARC) that may be deposited above hard mask layer 408, so as to minimize detrimental interference effects, such as photoresist line width variation, during exposure and development of photoresist layer 412.

Layer 412 exemplifies a layer of photoresist that is applied over hard mask layer 408 and BARC layer 410, which in one embodiment, consists of a photoresist with optimized reaction qualities at a UV wavelength of 193 nm. Various factors, however, impacting photoresist effectiveness at 193 nm become prevalent. First, etch resistance becomes a factor, since the thickness of photoresist layer 412 is generally in the 100-200 nm range, which is a reduction in the thickness of photoresist used in previous logic generations. As such, etch resistance of the 193 nm photoresist should be increased, which as discussed above, may be accomplished using hard mask layer 408.

Photoresist collapse is a phenomenon which can become prevalent as the photoresist aspect ratio increases. Surface tension, for example, caused by the removal of developer and rinse water from developed substrates causes closely-spaced, high aspect ratio photoresist lines to be pulled together. The aspect ratio of photoresist that is needed to form polysilicon interconnects 206, 208 is on the order of 3:1, since the photoresist thickness of layer 412 is targeted at, e.g., 150 nm, while the photoresist width is targeted at, e.g., 55 nm. Thus, as the aspect ratio of the photoresist is reduced to prevent photoresist collapse, the use of hard mask layer 408 is made even more desirable.

Turning to FIG. 5A, an exemplary flow diagram is illustrated that may be used during a first processing sequence to form polysilicon interconnect lines 206, 208 as exemplified in FIG. 2. Photoresist deposition of step 502 includes a process, whereby a uniform, adherent, and defect free photoresist film of correct thickness is deposited to form photoresist layer 412 of FIG. 4. The photoresist film is generally applied by spin coating the wafer, whereby the photoresist is dispensed over the wafer's surface and is followed by a rapid spin cycle of the wafer until the photoresist dries. Step 504 includes a soft bake cycle, which serves to drive away solvent from the spun-on photoresist layer, improve the adhesion of the photoresist to the wafer, and anneal the shear stresses imposed upon the photoresist during the spin coating.

In step 506, a geometric pattern is superimposed onto photoresist layer 412, so as to generate interconnect patterns 206 and 208 as exemplified in FIG. 3. In one embodiment, a negative photoresist may be applied in step 502, whereby portions of the photoresist that are exposed to radiation, e.g., UV radiation, are rendered insoluble to the photoresist development and trimming processes that are performed in step 508. Thus, portions 310 of FIG. 3 represent those portions of the negative photoresist layer that have been exposed to radiation and, therefore, remain on the wafer after the photoresist development and trimming processes are performed in step 508.

Conversely, a positive photoresist may be applied in step 502, whereby portions of the photoresist that are exposed to radiation, e.g., UV radiation, are rendered soluble to the photoresist development and trimming processes that are performed in step 508. Thus, portions 308 of FIG. 3 represent those portions of the positive photoresist layer that have been exposed to radiation and, therefore, are removed from the wafer after the photoresist development and trimming processes are performed in step 508.

As discussed above, the mask pattern of FIG. 3 is designed such that portions 302-306 are not affected by the photoresist development and trimming process of step 508. That is to say, in other words, that by removing the trimming process from photoresist portions 302-306, shrinkage of features ultimately defining polysilicon interconnects 206, 208 are precluded from also causing detrimental shrinkage effects on the features that are to be subsequently defined within portions 302-306.

In order to enhance the resolution of features defined by the mask pattern of FIG. 3, attenuated phase-shift masking may be employed, whereby the optical phase of the UV transmission may be altered between portions 310 and portions 308. For example, the phase of the transmitted UV radiation passing through portions 308 may be phase shifted by 180 degrees with respect to the phase of light passing through portions 310. As such, contrast is increased between portions 308 and 310 because UV radiation that is diffracted into regions 310 from regions 308 during step 506 interferes destructively to effectively cancel diffractions at the transitions between portions 310 and portions 308. Alternating phase-shift masking may instead be employed, whereby the optical phase of the UV transmission is only altered between adjacent portions 308, e.g., portions 308 that exist between interconnect lines 206 and 208.

As discussed above, step 508 includes a development process that removes unwanted photoresist from regions 308. Development may include any one of immersion, spray, or puddle developing to convert the latent image generated by the exposure of step 506 into a final image that serves as the mask for subsequent etching or ion implantation steps.

Step 508, however, also facilitates trimming of photoresist within regions 310, which remains to protect underlying polysilicon layer 406 from chemical attack during step 510. In particular, a mild oxygen plasma treatment may be implemented during step 508 to trim photoresist within regions 310, whereby all dimensions including the height and width of photoresist lines 206, 208 shrink.

As such, photoresist lines 206, 208 may shrink to a correct width of, e.g., 55 nm, and a correct thickness of, e.g., 150 nm, during photoresist development and trimming of step 508. Photoresist in regions 302-306 is left intact, however, so as to facilitate the development of device spacing 210 and poly-to-contact enclosures 216,218 during a second processing sequence as discussed in more detail below. In step 510, hard mask layer 408 in regions 308 is etched to remove hard mask portions 308, so as to transfer the features defined by interconnect lines 206, 208 onto hard mask layer 408.

That is to say, in other words, that after processing step 510 is executed, photoresist 412, BARC 410, and hard mask 408 are etched away from areas 308 of FIG. 3. If the optional polysilicon etch of step 510 is also performed, then polysilicon 406 is also etched away from areas 308, so as to transfer the features defined by interconnect lines 206, 208 onto polysilicon layer 406. In one embodiment, step 512 is not performed, so that the remaining photoresist layer, as well as all other layers of the starting material exemplified in FIG. 4, remain in areas 310 after the processing step 510 is executed. In such an instance, the remaining photoresist applied in step 502 may be reused during the second processing sequence as discussed below in relation to FIG. 5B.

Turning to FIG. 5B, an exemplary flow diagram is illustrated that may be used during a second processing sequence to form polysilicon enclosures 216, 218 and device spacing 210 as exemplified in FIG. 2. The optional photoresist deposition of step 552 and the soft bake cycle of step 554 are processed, as discussed above in relation to steps 502 and 504 of FIG. 5A, but only if the first layer of photoresist was removed as in step 512.

Figure 6:
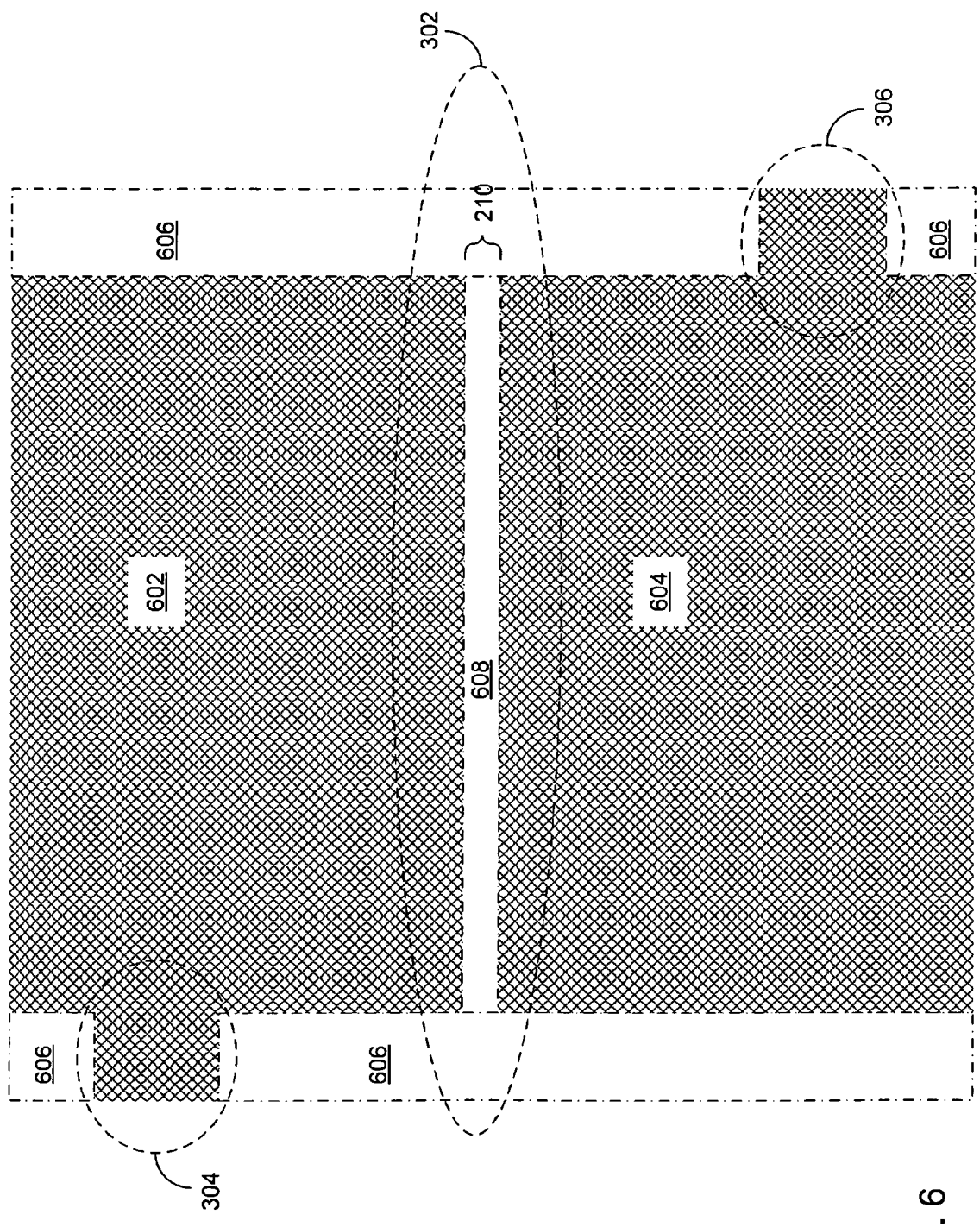
FIG. 6 illustrates an exemplary exposure mask pattern used for the second processing sequence during the formation of the interconnect pattern of FIG. 2.

In step 556, the geometric pattern, as exemplified in FIG. 6, is superimposed onto photoresist layer 412, via UV exposure, so as to define a second lithographic image after the first processing sequence of FIG. 5A is finished. Similar phase-shift masking techniques, as discussed above in relation to step 506, may be employed to increase the resolution of features defined by the mask pattern of FIG. 6. Portions 602, 604 represent regions that were developed during the first processing sequence, as discussed above in relation to FIGS. 3 and 5A, within which interconnect lines 206, 208 were created. As such, portions 602, 604 remain protected from processing steps 556-560 though the use of an appropriate mask that prohibits re-exposure and re-development of photoresist in portions 602, 604.

Portions 606, on the other hand, are made to be soluble to the etching process performed in step 560, by the pattern exposure and photoresist development processes of steps 556-558, respectively, whereby hard mask 408 and polysilicon 406 in regions 606 are etched away. As such, polysilicon enclosures 216, 218 within regions 304, 306, respectively, may be etched to within tight tolerances so as to maintain the critical dimensions of polysilicon enclosures 216, 218 for improved process margin.

It should be noted, that step 558 of the second processing sequence of FIG. 5B differs from step 508 of the first processing sequence of FIG. 5A because photoresist trimming is not performed in step 558, whereas photoresist trimming is performed in step 508. As such, critical dimensions defined within the photoresist layer after the second exposure of step 556 are protected from shrinkage. That is to say, in other words, that the surface area of polysilicon enclosures 216, 218 is maintained larger than the surface area of contacts 212, 214 so as to minimize the impedance of poly-to-contact 212/216 and poly-to-contact 214/218.

In addition, portion 608 is made to be soluble to the etching process performed in step 560, whereby hard mask 408 and polysilicon 406 in region 608 is etched away. As such, device spacing 210 within region 302 may be etched to within tight tolerances so as to maintain the critical dimensions of device spacing 210 for improved process margin. That is to say, in other words, that nanometer processes producing 65 nm and 45 nm gate lengths may reliably achieve device spacing 210 of, for example, 120 nm for acceptable yields. Finally, residual photoresist layer 412 and hard mask layer 408 are removed as in step 562.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An interconnect structure, comprising:
a substrate;
a first diffusion region within the substrate;
a plurality of first lines on the substrate and the first diffusion region;
a first enclosure coupled to an end of the plurality of first lines;
a first contact within the first enclosure;
a second diffusion region within the substrate;
a plurality of second lines on the substrate and the second diffusion region;
a second enclosure coupled to an end of the plurality of second lines;
a second contact within the second enclosure; and
a spacing between the plurality of first lines and the plurality of second lines,
wherein the plurality of first lines, the first contact, the plurality of second lines,
and the second contact are trimmed, but the first enclosure, the second
enclosure, and the spacing are not trimmed.

2. The interconnect structure of claim 1, wherein the plurality of first lines are a plurality of first polysilicon lines, and the plurality of second lines are a plurality of second polysilicon lines.

3. The interconnect structure of claim 1, wherein the first enclosure is a first polysilicon enclosure, and the second enclosure is a second polysilicon enclosure.

4. The interconnect structure of claim 1, wherein a surface area of the first enclosure is larger than a surface area of the first contact, and a surface area of the second enclosure is larger than a surface area of the second contact.

* * * * *